US 8,862,959 B1

(12) United States Patent
Dar et al.

(10) Patent No.: US 8,862,959 B1
(45) Date of Patent: Oct. 14, 2014

(54) SIGN EQUALIZATION IN ITERATIVE DECODING OF SPARSE GRAPH CODES

(71) Applicant: Apple Inc., Cupertino, CA (US)

(72) Inventors: Ronen Dar, Tel Aviv (IL); Tomer Ish-Shalom, Raanana (IL)

(73) Assignee: Apple Inc., Cupertino, CA (US)

( * ) Notice: Subject to any disclaimer, the term of this patent is extended or adjusted under 35 U.S.C. 154(b) by 60 days.

(21) Appl. No.: 13/747,559

(22) Filed: Jan. 23, 2013

(51) Int. Cl.
  *H03M 13/00* (2006.01)
  *G06F 11/10* (2006.01)
  *H03M 13/11* (2006.01)
(52) U.S. Cl.
  CPC ............. *G06F 11/10* (2013.01); *G06F 11/1008* (2013.01); *H03M 13/1102* (2013.01); *H03M 13/1131* (2013.01)
  USPC ............................ 714/752; 714/786; 714/801
(58) Field of Classification Search
  CPC .......................... H03M 13/1102; H03M 13/11
  USPC .................................................. 714/752, 758
  See application file for complete search history.

(56) References Cited

U.S. PATENT DOCUMENTS

| 7,519,898 | B2 | 4/2009 | Narayanan et al. | |
|---|---|---|---|---|
| 7,673,223 | B2 * | 3/2010 | Richardson et al. | 714/780 |
| 8,010,869 | B2 | 8/2011 | Wehn et al. | |
| 8,196,005 | B2 * | 6/2012 | Kienle et al. | 714/755 |
| 8,291,299 | B2 | 10/2012 | Li et al. | |
| 8,433,971 | B2 * | 4/2013 | Blanksby et al. | 714/752 |
| 8,555,131 | B2 * | 10/2013 | Rault et al. | 714/752 |
| 8,671,323 | B2 * | 3/2014 | Sham et al. | 714/755 |
| 8,677,227 | B2 * | 3/2014 | Gross et al. | 714/807 |

FOREIGN PATENT DOCUMENTS

WO    2009/023298 A1    2/2009

OTHER PUBLICATIONS

"Efficient Decoder Design for High-Throughput LDPC Decoding", Zhiqiang Cui, et al., 2008, pp. 1640-1643.

* cited by examiner

*Primary Examiner* — Esaw Abraham
(74) *Attorney, Agent, or Firm* — Meyertons, Hood, Kivlin, Kowert & Goetzel, P.C.

(57) ABSTRACT

A method includes, in an Error Correction Code (ECC) decoder that includes variable nodes and check nodes, receiving in a given variable node Check-to-Variable (C2V) messages from a subset of the check nodes. Magnitudes for respective Variable-to-Check (V2C) messages to be sent to the check nodes in the subset are computed based on the received C2V messages. A single sign is computed, for use in all the V2C messages to be sent from the given variable node to the check nodes in the subset. The V2C messages are sent from the given variable node to the check nodes in the subset, such that each V2C message includes a respective magnitude and the single sign.

22 Claims, 2 Drawing Sheets

SIGN EQUALIZATION IN ITERATIVE DECODING OF SPARSE GRAPH CODES

FIELD OF THE INVENTION

The present invention relates generally to Error Correction Coding (ECC), and particularly to methods and systems for ECC decoding.

BACKGROUND OF THE INVENTION

Some types of error correction codes, such as Low Density Parity Check (LDPC) codes, are commonly decoded using iterative decoding processes. Various iterative decoding schemes and decoder configurations are known in the art.

For example, Cui et al. describe a matrix permutation scheme that enables efficient decoder implementation, in "Efficient Decoder Design for High-Throughput LDPC decoding," IEEE Asia Pacific Conference on Circuits and Systems, November, 2008, which is incorporated herein by reference. This paper also describes implementation schemes for min-sum based column-layered decoding.

SUMMARY OF THE INVENTION

An embodiment of the present invention that is described herein provides a method including, in an Error Correction Code (ECC) decoder that includes variable nodes and check nodes, receiving in a given variable node Check-to-Variable (C2V) messages from a subset of the check nodes. Magnitudes for respective Variable-to-Check (V2C) messages to be sent to the check nodes in the subset are computed based on the received C2V messages. A single sign is computed, for use in all the V2C messages to be sent from the given variable node to the check nodes in the subset. The V2C messages are sent from the given variable node to the check nodes in the subset, such that each V2C message includes a respective magnitude and the single sign.

In some embodiments, computing the single sign includes calculating the single sign depending on all the received C2V messages. In an embodiment, computing the single sign includes summing the received C2V messages. In a disclosed embodiment, computing the single sign includes calculating the single sign to be sent to a given check node depending on a C2V message received from the given check node.

In another embodiment, computing the magnitudes includes computing a magnitude for a V2C message to be sent to a given check node depending on a channel message and the C2V messages received from the check nodes in the subset other than the given check node. In yet another embodiment, at least two of the magnitudes differ from one another. In still another embodiment, computing the magnitudes includes identifying a V2C message for which an individual sign computation would produce a sign that is different from the single sign, and setting a magnitude of the identified V2C message to indicate a low confidence level.

In some embodiments, computing the single sign includes storing in a memory only a single copy of the single sign for use in all the V2C messages. In an embodiment, the ECC decoder includes an iterative Low Density Parity Check (LDPC) code decoder. The method may include receiving an information-bearing signal over a communication channel and providing hard or soft bit decisions derived from the signal to the decoder for decoding. Alternatively, the method may include reading a group of memory cells from a memory device and providing hard or soft bit decisions derived from the read memory cells to the decoder for decoding.

There is additionally provided, in accordance with an embodiment of the present invention, an ECC decoder including a memory and logic circuitry. The logic circuitry includes variable nodes and check nodes and is configured to receive in a given variable node Check-to-Variable (C2V) messages from a subset of the check nodes, to compute and store in the memory, based on the received C2V messages, magnitudes for respective Variable-to-Check (V2C) messages to be sent to the check nodes in the subset, to compute and store in the memory a single sign to be used in all the V2C messages to be sent from the given variable node to the check nodes in the subset, and to send the V2C messages from the given variable node to the check nodes in the subset such that each V2C message includes a respective magnitude and the single sign.

The present invention will be more fully understood from the following detailed description of the embodiments thereof, taken together with the drawings in which:

DETAILED DESCRIPTION OF EMBODIMENTS

Overview

Some types of ECC, such as LDPC codes, are defined by multiple check equations that are defined over multiple variables. Some iterative ECC decoders comprise multiple check nodes corresponding to the check equations, and multiple variable nodes corresponding to the variables. The check node of a given equation is connected to the variable nodes of the variables that appear in that equation. A decoder of this sort decodes the ECC by exchanging messages between check nodes and variable nodes that are connected to one another, attempting to converge to a state where the variable nodes hold a valid code word.

Embodiments of the present invention provide improved iterative ECC decoder configurations and associated methods. In each decoding iteration, each variable node receives Check-to-Variable (C2V) messages from its connected check nodes, and subsequently computes and sends Variable-to-Check (V2C) messages to the connected check nodes. Upon receiving these V2C messages, each C node computes and sends C2V messages. In the disclosed embodiments, a given variable node computes and sends all the V2C messages in a given iteration with the same sign. The magnitudes of the V2C messages may differ from one another, but all the V2C messages are computed and sent with the same sign (in contrast to common message-passing algorithms that send different signs).

Since the V2C messages sent from a given variable node are indicative of the likelihood of the corresponding variable to have a certain data value, the various V2C messages are likely to have the same sign. In low Signal-to-Noise Ratio (SNR) regimes (high bit error rates) this sub-optimality is Negligible, and therefore the disclosed technique causes little degradation in the decoding performance. At the same time, the disclosed technique reduces memory size and computational complexity, because it computes and stores only a single sign bit for all V2C messages in each V node.

SYSTEM DESCRIPTION

Figure 1:
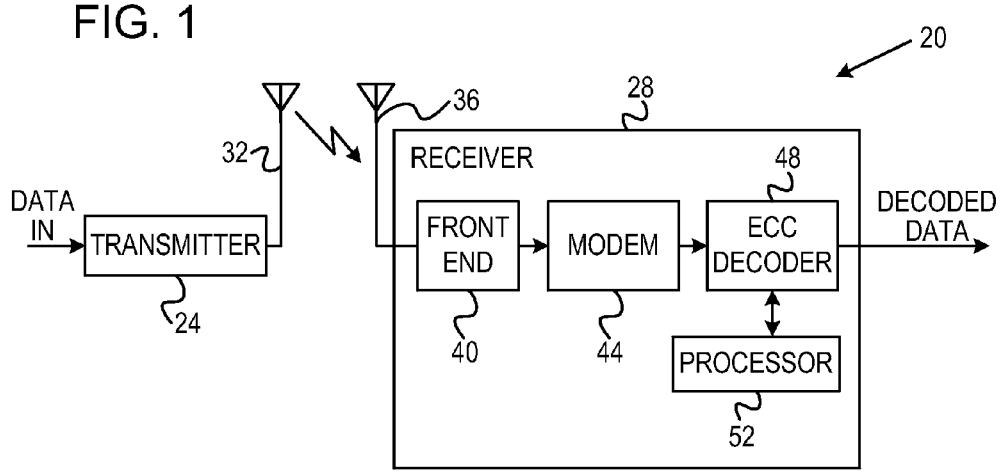
FIG. 1 is a block diagram that schematically illustrates a communication system that uses Error Correction Coding (ECC), in accordance with an embodiment of the present invention.

FIG. 1 is a block diagram that schematically illustrates a wireless communication system 20 that uses error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
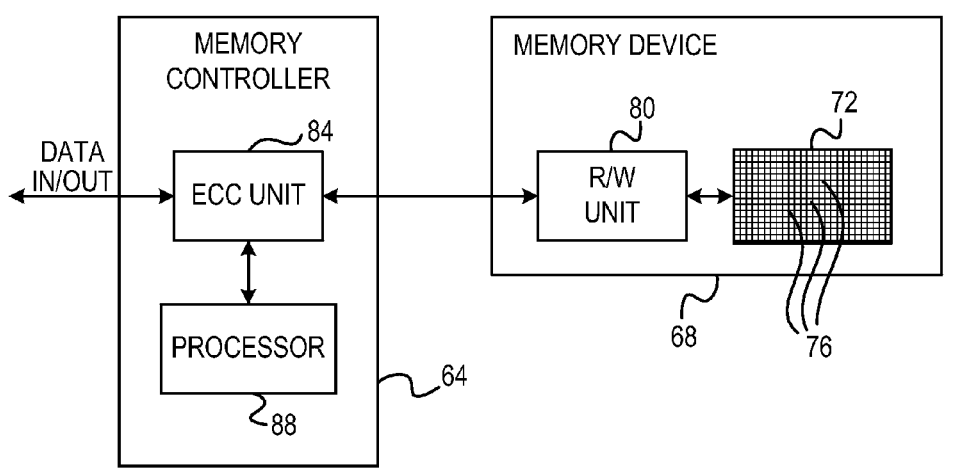
FIG. 2 is a block diagram that schematically illustrates a memory system that uses Error Correction Coding (ECC), in accordance with an embodiment of the present invention.

FIG. 2 is a block diagram that schematically illustrates a data storage system 60 that uses error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a Low Density Parity Check (LDPC) code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Figure 3:
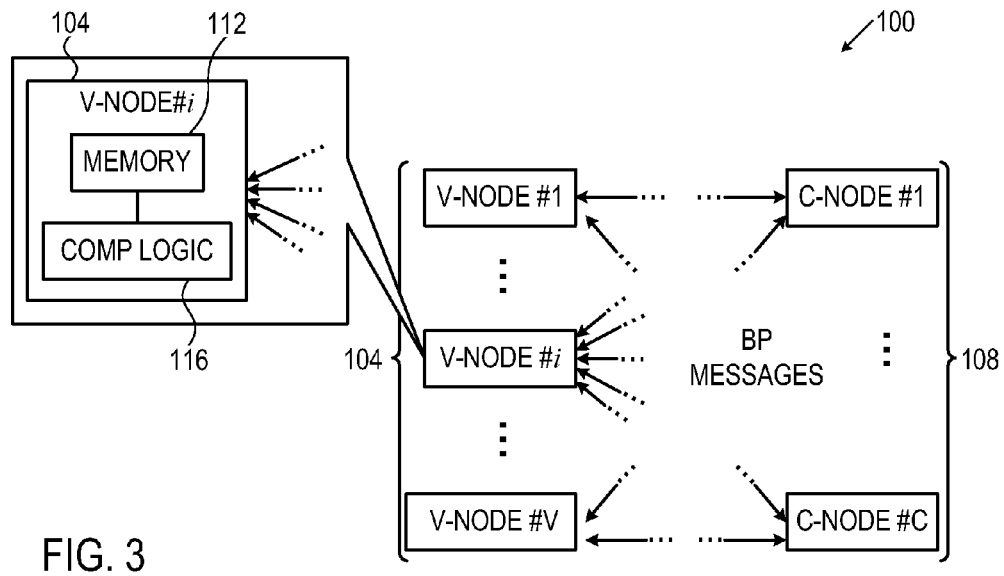
FIG. 3 is a block diagram that schematically illustrates a message-passing LDPC decoder, in accordance with an embodiment of the present invention.

FIG. 3 is a block diagram that schematically illustrates an iterative LDPC decoder 100, in accordance with an embodiment of the present invention. Decoder 100 can be used to implement decoder 48 of FIG. 1 above, or ECC unit 84 of FIG. 2 above. Typically, hard/soft decisions are made on the bits read from a group of memory cells. Decoder 100 accepts hard or soft decisions, which may contain errors. The ECC decoder decodes the input decisions while attempting to correct these errors, so as to reconstruct the data conveyed in the code words.

In a typical implementation, each code word comprises on the order of several hundred to several thousand bits, although any other suitable code word size can be used. The description that follows refers mainly to LDPC codes. In alternative embodiments, however, the ECC may comprise any other suitable code that can be represented by a (usually sparse) graph of variable nodes connected to check nodes.

The LDPC code in question is defined by a set of C check equations, which are defined over a set of V variables (e.g., bits for a binary LDPC code). Decoder 100 comprises a set of V variable nodes (V-nodes) 104 denoted V-node#1 . . . V-node#V, and a set of C check nodes (C-nodes) 108 denoted C-node#1 . . . C-node#C. Each V-node is associated with a respective variable, and each C-node is associated with a certain check equation.

V-nodes 104 and C-nodes 108 are connected by arcs (shown as arrows in the figure) in accordance with the check equations of the code. The V-node of each variable is connected to the C-nodes of the equations in which that variable appears. The C-node of each check equation is connected to the V-nodes of the variables appearing in that equation. In other words, an edge exists between a C-Node and a V-Node if and only if the corresponding entry in the parity check matrix of the codes is not null.

Since the LDPC code is sparse, each V-node is typically connected only to a small subset of the C-nodes, and each C-node is typically connected only to a small subset of the V-nodes. Each V-node 104 comprises a respective memory 112 and respective computation logic circuitry 116 (referred to herein as "logic" for brevity), whose functions are explained in detail further below. In the embodiment of FIG. 3, each V-node 104 is associated with a respective local memory 112 and respective local logic 116. Alternatively, however, memory 112 and/or logic 116 may serve multiple V-nodes or even all V-nodes.

The description that follows refers mainly to binary LDPC codes, in which case the variable nodes are also referred to as bit nodes. The disclosed techniques, however, are similarly applicable to non-binary codes, as well.

In some embodiments, decoder 100 carries out an iterative Message-Passing (MP) decoding scheme. In an example MP scheme, V-nodes 104 are initialized with the respective bit values of the input soft decisions. The V-nodes and C-nodes exchange messages with one another over the arcs that connect them, attempting to converge to a state where the V-nodes hold the bit values of a valid LDPC code word. This scheme is sometimes referred to as Belief Propagation (BP), and the messages exchanged between the V-nodes and C-nodes are sometimes referred to as BP messages. The messages from the C-nodes to the V-nodes are referred to herein as C2V messages, and the messages from the V-nodes to the C-nodes are referred to herein as V2C messages.

Each C2V or V2C message can be broken into two components—sign and magnitude. In the V2C case, the sign component can be viewed as the current decision on the value of the bit associated with this V-node. (The decision is regarded current and not final because it is based only on the C2V massages participating in the computation of the V2C massage. If all C2V massages were used, then the sign component could be viewed as the final decision on the bit associated with this V-node.) The magnitude component holds a non-negative value that can be viewed as the level of confidence associated with the sign component.

In the disclosed embodiments, decoder 100 carries out an efficient process of calculating the V2C messages. The disclosed process computes and sends all the V2C messages from a given V-node in a given decoding iteration with the same sign. This process simplifies the message calculation in logic 116 and uses only small memory space in memory 112. Example processes of this sort are described in detail below.

ECC decoder 48 of FIG. 1, ECC unit 84 of FIG. 2 and ECC decoder 100 of FIG. 3 may be implemented in software, in hardware, or using a combination of hardware and software elements. In some embodiments, decoder 48, unit and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including V-nodes 104 including memory 112 and logic 116, and C-nodes 108) are implemented in hardware, such as using one or more Application-Specific Integrated Circuits (ASICs), Field-Programmable Gate Arrays (FPGAs) and/or discrete components. Some or all of the decoder functions may alternatively be implemented in software, or using a combination of software and hardware elements.

Efficient Single-Sign V2C Message Computation

In a typical BP decoding process, the various V-nodes and C-nodes of decoder 100 are scanned iteratively in some order. Each full scan over the V-nodes and C-nodes is typically regarded as a complete iteration. In each iteration, each V-node receives C2V messages from the C-nodes that are connected to that V-node, and uses the C2V messages as well as the channel messages to compute V2C messages for sending back the C-nodes.

The V2C messages sent from a given variable node in a given iteration are indicative of the likelihood of the corresponding variable to have a certain data value. Therefore, in most cases all these V2C messages are likely to have the same sign (i.e., indicate the same data value) with possibly varying magnitudes (i.e., varying confidence level for the data value). Typically, if a particular V2C message has a sign that differs from the others, it will most likely have a very low magnitude (confidence level).

Thus, in some embodiments, logic 116 of a given V-node 104 computes all the V2C messages to be sent from this V-node in a given iteration, such that all these V2C messages have the same sign. Two or more of the magnitudes of the V2C messages, or even all the magnitudes, may differ from one another. Logic 116 stores the V2C messages in memory 112, and subsequently sends them to the respective C-nodes 108. By computing and storing only a single sign bit for all the V2C messages, the memory space needed in memory 112 is reduced—It is proportional to the number of transmitted bits. Computational complexity may be reduced, as well.

In various embodiments, decoder 100 may compute the C2V and V2C messages, and in particular logic 116 may compute the V2C messages, in different ways. In an example embodiment, the sign of the C2V message from a given C-node to the $i^{th}$ V-node comprises the Exclusive OR (XOR) of all incoming V2C sign messages, and the magnitude of this C2V messages is the minimum of the incoming V2C messages, excluding the message from the $i^{th}$ V-node.

In this embodiment, the sign of the V2C message from a given V-node to the $j^{th}$ C-node comprises a sum over the values of all incoming C2V messages to this V-node (each is equal to the C2V magnitude times the sign) and the channel Log Likelihood Ratio (LLR). The V2C sign component is determined after comparing this sum with a predefined threshold. Since the C2V message from the $j^{th}$ C-node is not excluded from the sign calculation, the signs of all the V2C messages from the given V-node will be the same.

The magnitude of the V2C message from the given V-node to the $j^{th}$ C-node comprises the absolute value of the sum over the values of the incoming C2V messages to this V-node and the channel LLR, excluding the C2V message from the $j^{th}$ C-node. Since the C2V message from the $j^{th}$ C-node is excluded from the magnitude calculation, V2C messages from the given V-node to different C-nodes may have different magnitudes.

Simulations performed by the inventors indicate that at high block error rates, the use of a single sign causes only minor degradation in the decoding performance of the decoder. Thus, in a decoder that scans the V-nodes in series ("serial-V" decoder), the memory size required in the V nodes is proportional only to the number of V nodes. Furthermore, a significant improvement in the computation complexity of the decoder may be achieved.

In alternative embodiments, decoder 100 may compute the V2C and C2V messages in any other suitable way.

In an example embodiment, logic 116 of a given V-node examines the set of V2C messages to be sent to the various C-nodes. If logic 116 detects that the sign of a V2C message to a given C-node would have been different if the sign were calculated individually for that message (e.g., while excluding the C2V message from the given C-node), then logic 116 sets the minimal magnitude (lowest confidence level) for this V2C message.

Figure 4:
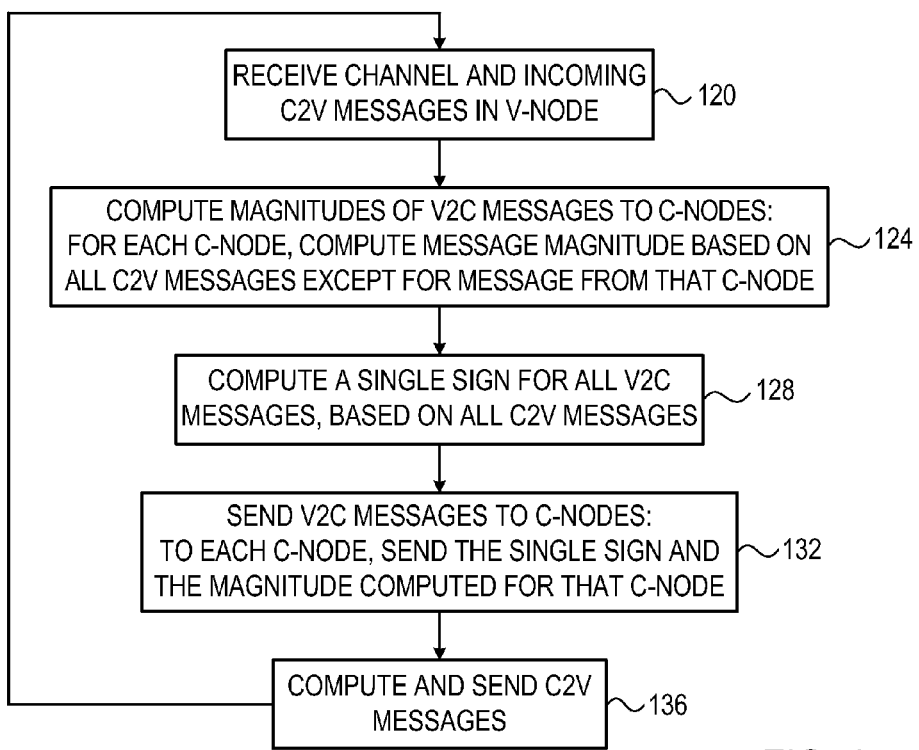
FIG. 4 is a flow chart that schematically illustrates a method for message-passing decoding, in accordance with an embodiment of the present invention.

FIG. 4 is a flow chart that schematically illustrates a method for message-passing decoding, in accordance with an embodiment of the present invention. The method begins with logic 116 of a given V-node receiving C2V messages from the C-nodes connected to the given V-node in the code graph, and a channel message, at a C2V input step 120.

Logic 116 computes the magnitudes of the V2C messages to be sent to the connected C-nodes, at a magnitude calculation step 124. The magnitude calculation $j^{th}$ of the V2C message destined to the $j^{th}$ C-node depends on the C2V messages arriving from the connected C-nodes except the $j^{th}$ C-node.

Logic 116 computes a single sign bit for the V2C messages to be sent to the various connected C-nodes, at a sign calculation step 128. The sign calculation depends on the C2V messages arriving from the connected C-nodes, without excluding the C2V message from the $j^{th}$ C-node. As such, all the signs to be sent from the given V-node in a given iteration are the same.

Logic 116 stores the magnitudes and signs of the various V2C messages in memory 112. Logic 116 sends the V2C messages to the connected C-nodes, at a V2C sending step 132. The C-nodes compute and send the C2V messages to the connected V-nodes, at a C2V messaging step 136.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
    in an Error Correction Code (ECC) decoder that includes variable nodes and check nodes, receiving in a given variable node Check-to-Variable (C2V) messages from a subset of the check nodes;
    based on the received C2V messages, computing magnitudes for respective Variable-to-Check (V2C) messages to be sent to the check nodes in the subset;
    computing a sign bit and including the sign bit in each respective V2C message for each of the check nodes in the subset, wherein the sign bit corresponds to a current decision on a value of a bit computed by the given variable node; and
    sending the respective V2C messages from the given variable node to the check nodes in the subset, wherein each V2C message comprises a respective magnitude and the sign bit.

2. The method according to claim 1, wherein computing the sign bit comprises calculating the sign bit depending on all the received C2V messages.

3. The method according to claim 1, wherein computing the sign bit comprises summing the received C2V messages.

4. The method according to claim 1, wherein computing the sign bit comprises calculating the sign bit to be sent to a given check node dependent upon a C2V message received from the given check node.

5. The method according to claim 1, wherein computing the magnitudes comprises computing a magnitude for a given V2C message to be sent to a respective check node dependent upon a channel message and the C2V messages received from the check nodes in the subset other than the respective check node.

6. The method according to claim 1, wherein at least two of the magnitudes differ from one another.

7. The method according to claim 1, wherein computing the magnitudes comprises identifying a V2C message for which an individual sign bit computation would produce a new value of the sign bit that is different from a current value of the sign bit, and setting a magnitude of the identified V2C message to indicate a low confidence level.

8. The method according to claim 1, wherein computing the sign bit comprises storing in a memory only a single copy of the sign bit for use in all the V2C messages for a current iteration.

9. The method according to claim 1, wherein the ECC decoder comprises an iterative Low Density Parity Check (LDPC) code decoder.

10. The method according to claim 1, and comprising receiving an information-bearing signal over a communication channel and providing hard or soft bit decisions derived from the signal to the decoder for decoding.

11. The method according to claim 1, and comprising reading a group of memory cells from a memory device and providing hard or soft bit decisions derived from the read memory cells to the decoder for decoding.

12. An Error Correction Code (ECC) decoder, comprising:
    a memory; and
    logic circuitry, which comprises variable nodes and check nodes and is configured to:
    receive in a given variable node Check-to-Variable (C2V) messages from a subset of the check nodes;
    compute and store in the memory, based on the received C2V messages, magnitudes for respective Variable-to-Check (V2C) messages to be sent to the check nodes in the subset;
    compute and store in the memory a sign bit and including the sign bit in each respective V2C message for each of the check nodes in the subset, wherein the sign bit corresponds to a current decision on a value of a bit computed by the given variable node; and
    send the respective V2C messages from the given variable node to the check nodes in the subset, wherein each V2C message comprises a respective magnitude and the sign bit.

13. The apparatus according to claim 12, wherein the logic circuitry is configured to calculate the sign bit depending on all the received C2V messages.

14. The apparatus according to claim 12, wherein the logic circuitry is configured to compute the sign bit by summing the received C2V messages.

15. The apparatus according to claim 12, wherein the logic circuitry is configured to calculate the sign bit to be sent to a given check node dependent upon a C2V message received from the given check node.

16. The apparatus according to claim 12, wherein the logic circuitry is configured to compute a magnitude for a given V2C message to be sent to a respective check node dependent upon a channel message and the C2V messages received from the check nodes in the subset other than the respective check node.

17. The apparatus according to claim 12, wherein at least two of the magnitudes differ from one another.

18. The apparatus according to claim 12, wherein the logic circuitry is configured to identify a V2C message for which an individual sign bit computation would produce a new value of the sign bit that is different from a current value of the sign bit, and to set a magnitude of the identified V2C message to indicate a low confidence level.

19. The apparatus according to claim 12, wherein the logic circuitry is configured to store in the memory only a single copy of the sign bit for use in all the V2C messages for a current iteration.

20. The apparatus according to claim 12, wherein the ECC decoder comprises an iterative Low Density Parity Check (LDPC) code decoder.

21. The method according to claim 12, and comprising a receiver that is configured to receive an information-bearing signal over a communication channel and to provide hard or soft bit decisions derived from the signal to the decoder for decoding.

22. The method according to claim 12, and comprising Read/Write (R/W) circuitry, which is configured to read a group of memory cells from a memory device and to provide hard or soft bit decisions derived from the read memory cells to the decoder for decoding.

* * * * *